United States Patent
Kim et al.

(10) Patent No.: US 7,656,181 B2
(45) Date of Patent: Feb. 2, 2010

(54) APPARATUS AND METHOD FOR TESTING CIRCUIT CHARACTERISTICS BY USING EYE MASK

(75) Inventors: Woo-Seop Kim, Seoul (KR);
Jun-Young Park, Pohang-si (KR);
Sung-Je Hong, Pohang-si (KR);
Sung-Bum Cho, Yongin-si (KR);
Byung-Se So, Seongnam-si (KR);
Hyun-Chul Kang, Pohang-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 107 days.

(21) Appl. No.: 11/490,984

(22) Filed: Jul. 21, 2006

(65) Prior Publication Data

US 2007/0018637 A1 Jan. 25, 2007

(30) Foreign Application Priority Data

Jul. 25, 2005 (KR) ...................... 10-2005-0067285

(51) Int. Cl.
*G01R 31/26* (2006.01)
(52) U.S. Cl. ..................................... 324/765
(58) Field of Classification Search ................. 324/765
See application file for complete search history.

(56) References Cited

U.S. PATENT DOCUMENTS

| | | | |
|---|---|---|---|
| 5,880,837 A | 3/1999 | Roberts | |
| 6,629,272 B1 | 9/2003 | Jungerman | |
| 6,735,543 B2 * | 5/2004 | Douskey et al. ............. | 702/120 |
| 6,806,877 B2 | 10/2004 | Fernando | |
| 6,812,688 B2 * | 11/2004 | Tan et al. ................ | 324/121 R |

(Continued)

FOREIGN PATENT DOCUMENTS

DE 1762661 7/1968

(Continued)

OTHER PUBLICATIONS

German Office Action dated Sep. 20, 2008.

*Primary Examiner*—Ha Tran T Nguyen
*Assistant Examiner*—Shaun Campbell
(74) *Attorney, Agent, or Firm*—F. Chau & Associates, LLC

(57) ABSTRACT

A test apparatus capable of detecting input/output (I/O) circuit characteristics of a semiconductor device by analyzing an eye mask generated in the test apparatus and the waveform of a test signal output from the I/O circuit of the semiconductor device. The test apparatus includes an eye mask generator that generates an eye mask in synchronization with one or more clock signals of opposite phase to each other, an error detector that receives the eye mask from the eye mask generator and compares the test signal with the eye mask to determine whether an error occurs in the semiconductor device, and an error signal output unit that receives an error detection signal from the error detector and generates an error signal in response to the error detection signal. In particular, the eye mask generator includes a sine wave generator that generates one or more sine waves of opposite phase to each other in synchronization with one or more clock signals, and a limiter circuit that receives the sine waves and generates the eye mask by adjusting the amplitudes of the sine waves.

22 Claims, 6 Drawing Sheets

U.S. PATENT DOCUMENTS

| | | | |
|---|---|---|---|
| 7,245,657 B2 * | 7/2007 | Yanai | 375/226 |
| 7,272,763 B2 * | 9/2007 | Gearhardt et al. | 714/733 |
| 2003/0041294 A1 * | 2/2003 | Moll et al. | 714/709 |
| 2003/0051086 A1 | 3/2003 | Smith et al. | |
| 2003/0097226 A1 | 5/2003 | Waschura et al. | |
| 2005/0129104 A1 | 6/2005 | Ishida et al. | |

FOREIGN PATENT DOCUMENTS

| | | |
|---|---|---|
| EP | 1508813 A1 | 2/2005 |
| JP | 2004-144748 | 5/2004 |
| KR | 1020020026841 A | 4/2002 |

* cited by examiner

Tx

Rx

APPARATUS AND METHOD FOR TESTING CIRCUIT CHARACTERISTICS BY USING EYE MASK

CROSS-REFERENCE TO RELATED PATENT APPLICATION

This application claims the priority of Korean Patent Application No. 10-2005-0067285, filed on Jul. 25, 2005, in the Korean Intellectual Property Office, the disclosure of which is incorporated herein in its entirety by reference.

BACKGROUND OF THE INVENTION

1. Technical Field

The present disclosure relates to a test apparatus and method and, more particularly, to an apparatus and method for testing the input/output circuit characteristics of a device under test (DUT) by using an eye mask generated in a test apparatus.

2. Discussion of the Related Art

In recent years, as the operating speeds of semiconductor devices, such as memory devices, have increased more testing requirements therefor are required. For instance, apparatuses that test semiconductor devices are also needed to operate at high speeds in accordance with the trend toward the high operating speeds of the semiconductor devices. However, in most cases, the operating speeds of the test apparatuses do not match the operating speeds of the semiconductor devices, and manufacturing costs are significantly increased in order to raise the operating speeds of the test apparatuses to match the operating speeds of the semiconductor devices.

FIG. 1 is a block diagram of a system for illustrating a conventional method of testing the performance of a semiconductor device 20, that is, a device under test (DUT), by using a tester 10, which is a general automatic test equipment (ATE) machine. The semiconductor device 20, such as a semiconductor memory device, typically includes an input/output (I/O) circuit 21, a memory core 22, and a control logic circuit 23.

More particularly, since the I/O circuit 21 of the semiconductor device 20 operates at high speeds, the operating characteristics of the I/O circuit 21 are tested by a system using the conventional method of FIG. 1. To test the operating characteristics of the I/O circuit 21, the tester 10 applies a test pattern to the semiconductor device 20. The test pattern applied to the semiconductor device 20 is output as a signal from the I/O circuit 21 of the semiconductor device 20 and returned back to the tester 10.

U.S. Pat. No. 6,629,272 discloses a bit error rate tester (BERT) that is an example of a conventional test apparatus that tests semiconductor devices. In the BERT, a test pattern is generated by a pattern generator and applied to a DUT, and signals output from the DUT are applied to an error detector. Then, the bit error ratio (BER) of each signal output from the DUT is compared with a BER generated in the error detector so as to detect an error.

US Patent Laid-Open Publication No. 2003-0097226 discloses another example of a conventional test apparatus that compares a binary coded pulse signal received via a transmission line with a voltage threshold window to determine the voltage of the pulse signal. The conventional test apparatus is programmed to use a maximum voltage Vmax and a minimum voltage Vmin as input values and to generate the voltage threshold window that is switched between the maximum voltage Vmax and the minimum voltage Vmin.

As described above, it is difficult to increase the operating speeds of conventional test apparatuses to match the increased operating speeds of semiconductor devices. It is possible, however, to allow a test apparatus to more easily test semiconductor devices using an eye mask. If the eye mask is generated by programming a maximum voltage and a minimum voltage in a software program, however, a lot of time is required, thus precluding any benefits from being obtained by such testing of a high-speed semiconductor device at high speeds.

SUMMARY OF THE INVENTION

Exemplary embodiments of the present invention provide a test apparatus and method for testing the characteristics of a semiconductor device by using an eye mask generated from sine waves, thereby precisely testing the performance of a semiconductor device that operates at high speeds.

According to an embodiment of the present invention, there is provided a test apparatus that tests a semiconductor device by receiving a signal from the semiconductor device via a transmission line and analyzing the received signal as a test signal, the test apparatus comprising an eye mask generator generating an eye mask in synchronization with one or more clock signals of different phase; an error detector receiving the eye mask from the eye mask generator and comparing the test signal with the eye mask to detect whether an error occurs; and an error signal output unit receiving an error detection signal from the error detector and generating an error signal in response to the error detection signal. The eye mask generator comprises a sine wave generator generating one or more sine waves in synchronization with one or more clock signals; and a limiter circuit receiving the sine waves, and generating the eye mask by limiting amplitudes of the sine waves.

The sine wave generator may respectively generate a first sine wave and a second sine wave of opposite phase to each other, in synchronization with two clock signals of opposite phase.

The limiter circuit may comprise a first limiter circuit receiving the first sine wave and generating an upper eye mask by limiting an amplitude of the first sine wave; and a second limiter circuit receiving the second sine wave and generating a lower eye mask by limiting an amplitude of the second sine wave.

According to an embodiment of the present invention, there is provided an apparatus for generating an eye mask, the apparatus comprising a sine wave generator generating a first sine wave and a second sine wave of opposite phase to each other in synchronization with one or more clock signals; a first limiter circuit receiving the first sine wave and generating an upper eye mask by limiting an amplitude of the first sine wave; and a second limiter circuit receiving the second sine wave and generating a lower eye mask by limiting an amplitude of the second sine wave.

According to an embodiment of the present invention, there is provided a method of testing a semiconductor device, the method comprising generating a first sine wave and a second sine wave of opposite phase to each other in synchronization with one or more clock signals; generating an upper eye mask by limiting an upper border and a lower border of the first sine wave, and a lower eye mask by limiting an upper border and a lower border of the second sine wave; determining whether an error occurs by comparing the test signal with the upper and lower eye masks; and generating an error signal in response to an error detection signal indicating whether the error occurs.

BRIEF DESCRIPTION OF THE DRAWINGS

Exemplary embodiments of the present invention will be understood in more detail from the following descriptions taken in conjunction with the attached drawings in which.

DETAILED DESCRIPTION OF EXEMPLARY EMBODIMENTS

Figure 1:
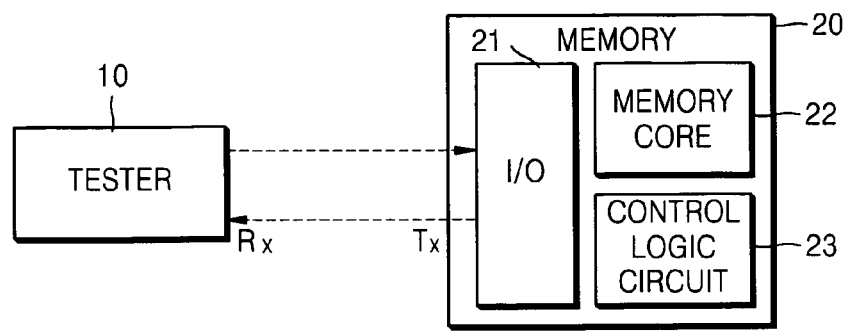
FIG. 1 is a block diagram of a system for illustrating a conventional method of testing the performance of a semiconductor device by using general automatic test equipment (ATE)

Hereinafter, exemplary embodiments of the present invention will be described in detail with reference to the accompanying drawings. Like reference numerals denote like elements throughout the drawings.

Figure 2:
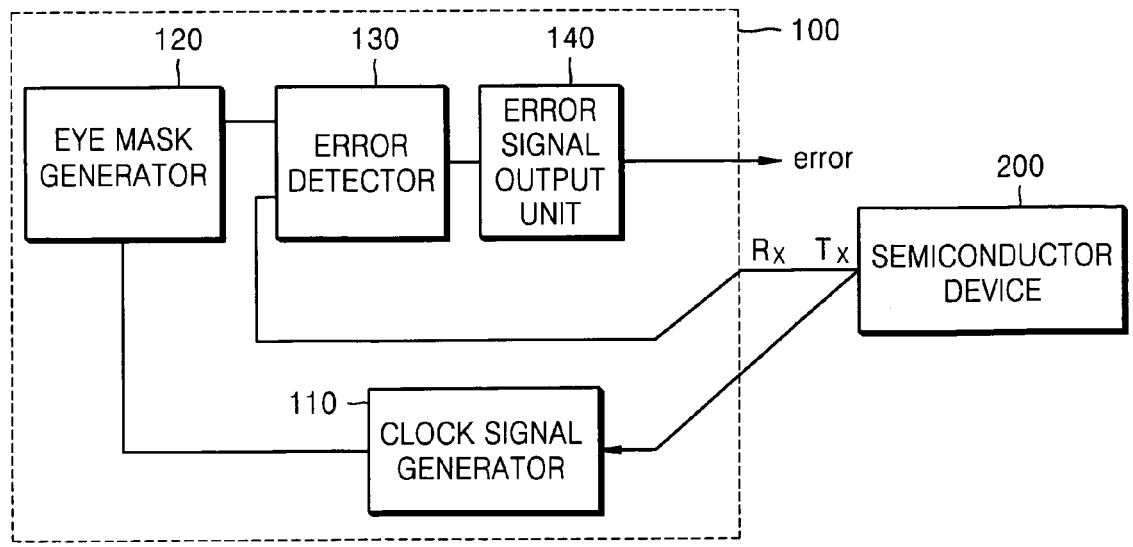
FIG. 2 is a block diagram illustrating a test apparatus according to an embodiment of the present invention.

FIG. 2 is a block diagram illustrating a tester 100 according to an embodiment of the present invention. Referring to FIG. 2, the tester 100 includes a clock signal generator 110, an eye mask generator 120, an error detector 130, and an error signal output unit 140.

The tester 100 applies a test pattern to a semiconductor device 200 to detect the operating characteristics of an input/output (I/O) circuit (not shown) of the semiconductor device 200. The test pattern applied to the semiconductor device 200 is output from the I/O circuit of the semiconductor device 200 and returned back to the tester 100. A transmission signal Tx output from an I/O terminal of the semiconductor device 200 is input to an I/O terminal of the tester 100 via a predetermined transmission line, and the input signal is used as a test signal Rx for the tester 100.

Figure 3A:
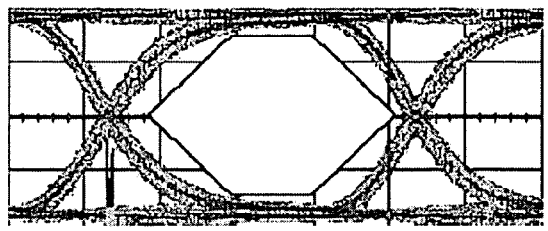
FIGS. 3A and 3B are eye diagrams illustrating waveforms of a transmission signal and a test signal in the apparatus shown in FIG. 2, according to an embodiment of the present invention.
Figure 3B:
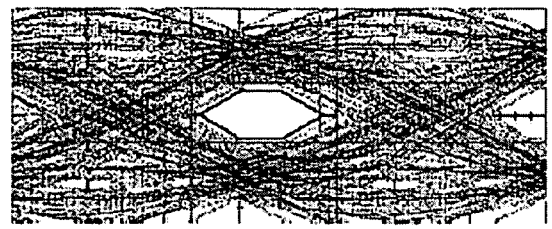

FIGS. 3A and 3B are eye diagrams illustrating the waveforms of the transmission signal Tx and the test signal Rx, shown in FIG. 2, according to an embodiment of the present invention. In particular, the eye diagrams show the relationship in jitter and noise between the transmission signal Tx and the test signal Rx output from the semiconductor device 200 via the I/O circuit.

Referring to FIG. 3A, the transmission signal Tx is hardly affected by jitter or noise, thus presenting a clear eye diagram and a large hexagonal eye mask.

In contrast, referring to FIG. 3B, the test signal Rx is input to the tester 100 via the transmission line, and thus is attenuated or deformed due to jitter or noise. Accordingly, the test signal Rx presents an unclear eye diagram and a small hexagonal eye mask.

A method of detecting errors by testing the I/O circuit characteristics of a semiconductor device using a test apparatus according to en embodiment of the present invention will now be described. First, an eye mask shown in FIG. 3B, is generated by the eye mask generator 120 of FIG. 2, and compared with the waveform of the test signal Rx. If a voltage level of the test signal Rx is between upper and lower voltage levels of the voltage of the eye, mask, it is determined that an error occurs.

Figure 4:
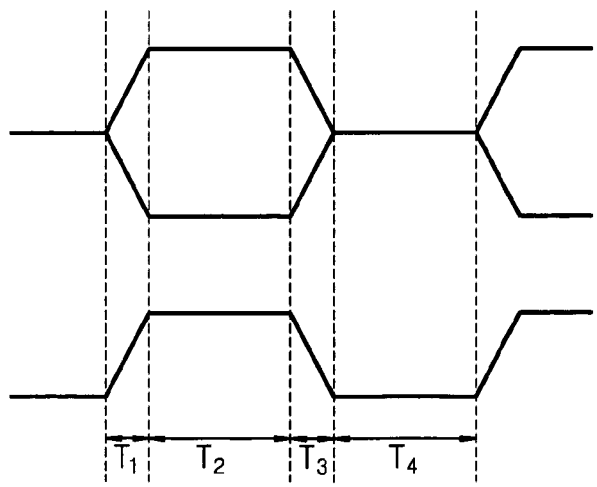
FIG. 4 illustrates an eye mask, in the diagrams of FIGS. 3A and 3B, which is assumed to have a regular hexagonal shape.

FIG. 4 illustrates an eye mask, of FIG. 3A and FIG. 3B, which is assumed to have a regular hexagonal shape. Referring to FIG. 4, it is assumed that the eye mask of FIG. 3A and FIG. 3B has a hexagonal shape and T1=T3 and T2=T4 in order to generate the eye mask. That is, it is assumed that the eye mask in an eye diagram is formed to have a regular hexagonal shape. In particular, based on the above assumption, it is possible to easily make a waveform with an eye mask using an eye mask generator.

Figure 5:
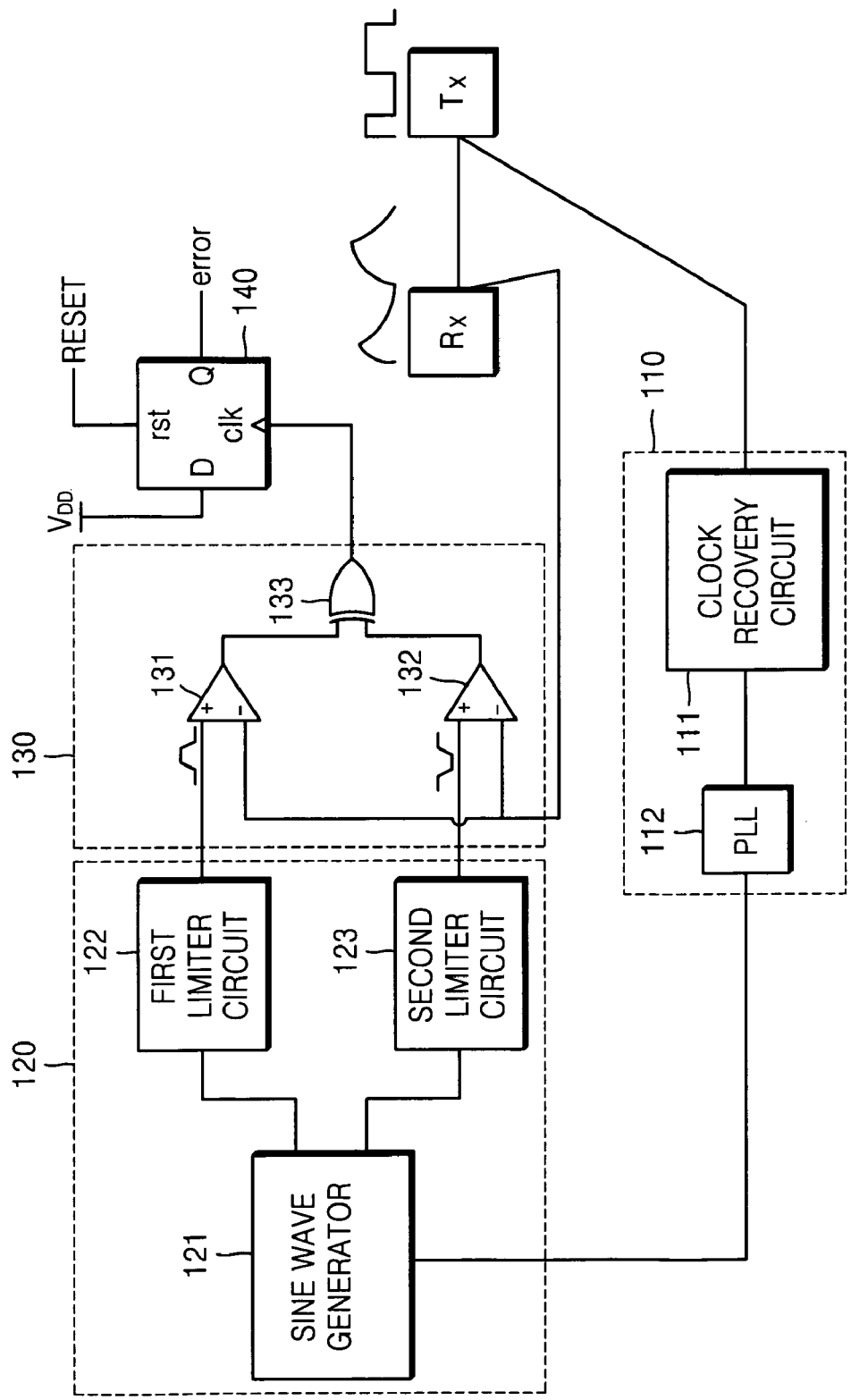
FIG. 5 is a circuit diagram of a test apparatus according to an embodiment of the present invention.

FIG. 5 is a circuit diagram of a test apparatus according to an embodiment of the present invention. Referring to FIG. 5, the test apparatus includes a clock signal generator 110, an eye mask generator 120, an error detector 130, and an error signal output signal 140.

When a test pattern output from the test apparatus is applied to an I/O circuit of a semiconductor device (not shown), a transmission signal Tx is output from the I/O circuit to the test apparatus. The transmission signal Tx output from an I/O terminal of the semiconductor device is a binary pulse bit stream, and transmitted to the test apparatus in the form of a binary pulse. The transmission signal Tx is applied to the test apparatus via a predetermined transmission line. The transmission line may be any device that can transmit signals at a high speed, for example, a printed circuit board trace, a coaxial cable, an optical fiber, or a radio and satellite link.

The transmission signal Tx is input to an I/O terminal of the test apparatus via the I/O terminal of the semiconductor device and is used as a test signal Rx for the test apparatus. The waveform of the test signal Rx is changed by the characteristics of the transmission line. As illustrated in FIG. 5, the test signal Rx is a binary bit stream that has a round shaped waveform caused by the transmission line.

The I/O circuit characteristics of the semiconductor device are determined by determining whether a signal error occurs by comparing an eye mask generated in the test apparatus with the waveform of the test signal Rx. The construction and operation of the test apparatus will now be described in greater detail.

The clock signal generator 110 may include a clock recovery circuit 111 and a phase locked loop (PLL) 112. When the transmission signal Tx which is a binary pulse bit stream is applied to the clock recovery circuit 111, the clock recovery circuit 111 extracts a clock signal from the received transmission signal Tx and applies the clock signal to the PLL 112. The PLL 112 synchronizes the clock signal at 0 and 180 degrees and transmits the synchronized result to the eye mask generator 120.

Although not shown, the clock recovery circuit 111 may be separated from the clock signal generator 110, and in this case, a predetermined pulse signal is applied directly to the PLL 112.

The eye mask generator 120 may include a sine wave generator 121 and at least one limiter circuit. The sine wave generator 121 generates one or more sine waves that are out of phase with each other, in response to a clock signal output from the PLL 112. In particular, the sine wave generator 121 may generate first and second sine waves of opposite phase to each other in synchronization with two clock signals of opposite phase, respectively. It is assumed that the first sine wave has a phase of 0 degrees and the second sine wave has a phase of 180 degrees.

In an embodiment of the present invention, the eye mask generator 120 includes a first limiter circuit 122 and a second limiter circuit 123. The first limiter circuit 122 receives the first sine wave having the phase of 0 degrees, and transforms the first sine wave into an upper eye mask by limiting the amplitude of the first sine wave. Similarly, the second limiter circuit 123 receives the second sine wave having the phase of 180 degrees and transforms it into a lower eye mask.

The upper and lower eye masks generated by the eye mask generator 120 are applied to the error detector 130. The error detector 130 sequentially compares the test signal Rx with the upper eye mask and the lower eye mask.

The error detector 130 may include at least one comparator, and a logic operator. In an embodiment of the present invention, the error detector 130 includes a first comparator 131 that compares the test signal Rx with the upper eye mask, and a second comparator 132 that compares the test signal Rx with the lower eye mask.

The upper eye mask and the test signal Rx are applied to two input terminals of the first comparator 131. The first comparator 131 compares the upper eye mask with the test signal Rx which is a binary pulse bit stream, and outputs a logic "high" first comparison signal when the level of the upper eye mask is greater than that of the test signal Rx.

Similarly, the second comparator 132 compares the lower eye mask with the test signal Rx, and outputs a logic "low" second comparison signal when the level of the lower eye mask is greater than that of the test signal Rx.

The first and second comparison signals are applied to the logic operator 133. As illustrated in FIG. 5, the logic operator 133 may be an XOR gate.

If the logic operator 133 is the XOR gate, the logic operator 133 generates a logic "low" error detection signal when the logic level of the first comparison signal is the same as that of the second comparison signal. In contrast, when the first and second comparison signals have different logic levels, the logic operator 133 generates a logic "high" error detection signal.

Cases where the logic operator 133 generates a logic "low" error detection signal will now be described in greater detail. First, when both the first and second comparison signals are logic "high", that is, when the logic level of the test signal Rx is lower than those of the upper and lower eye masks, the logic operator 133 generates a logic "low" error detection signal.

Second, when both the first and second comparison signals are logic "low", that is, when the logic level of the test signal Rx is higher than those of the upper and lower eye masks, the logic operator 133 generates a logic "low" error detection signal. Both the above two cases indicate that the semiconductor device operates without errors.

On the other hand, the logic operator 133 generates a logic "high" error detection signal when the first and second comparison signals have different logic levels, that is, when the logic level of the test signal Rx is between the logic levels of the upper and lower eye masks. In this case, the test signal Rx fails to preserve data information of logic "low' or logic "high", thus causing an error to occur in the operation of the semiconductor device.

The error signal output unit 140 receives the error detection signal from the error detector 130, and generates an error signal error in response to the error detection signal. In an embodiment of the present invention, the error signal output unit 140 is a flipflop.

To test the semiconductor device, first, a reset signal RESET for the error signal output unit 140 is set to "1". When the flipflop is reset in response to the reset signal RESET, the error detection signal output from the error detector 130 is applied to a CLK terminal of the error signal output unit 140. When the error detection signal transits from low to high, the error signal output unit 140 is activated to change the error signal error to a VDD level, thereby indicating that an error was detected in the operating semiconductor device.

Figure 6A:
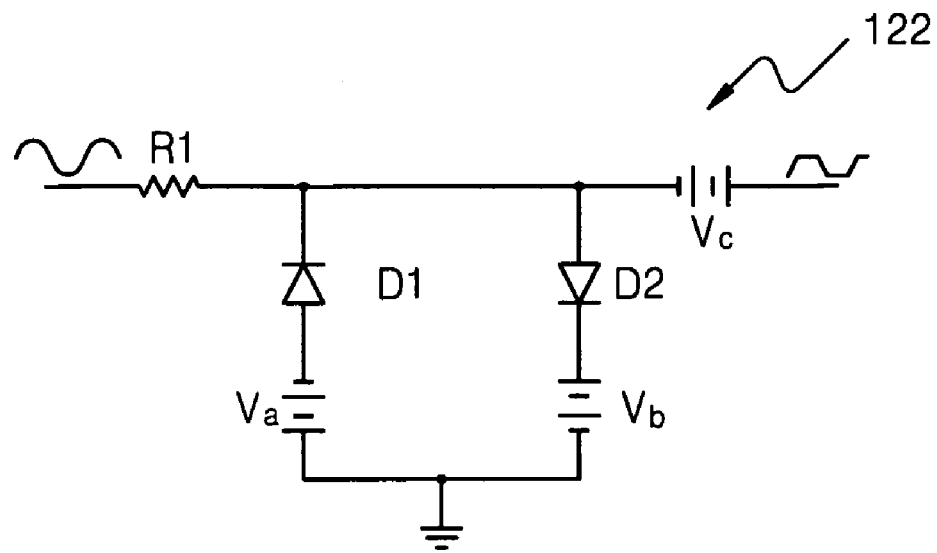
FIG. 6A is a circuit diagram of a first limiter circuit in the circuit shown in FIG. 5 according to an embodiment of the present invention.
Figure 6B:
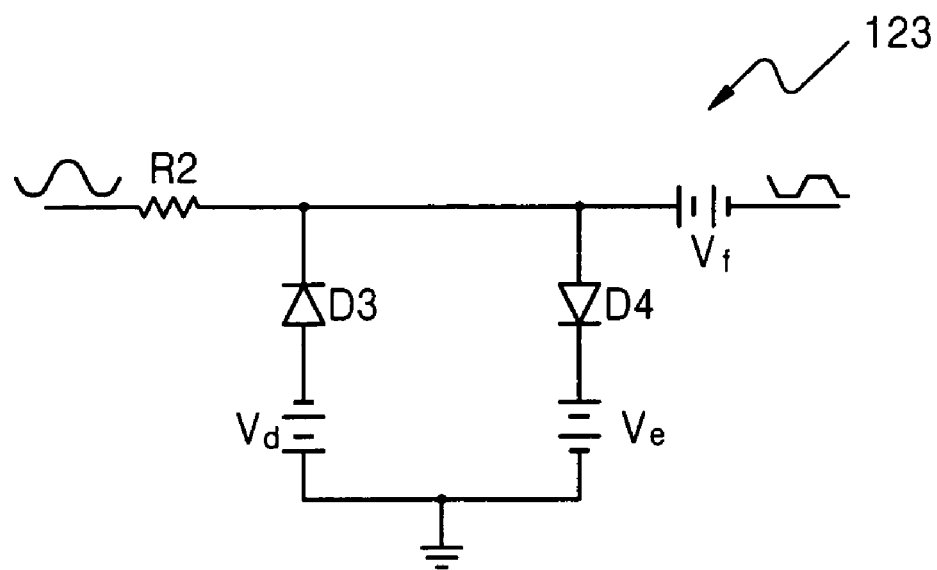
FIG. 6B is a circuit diagram of a second limiter circuit in the circuit shown in FIG. 5 according to an embodiment of the present invention.

FIG. 6A is a circuit diagram illustrating the first limiter circuit 122 of FIG. 5 according to an embodiment of the present invention, and FIG. 6B is a circuit diagram illustrating the second limiter circuit 123 of FIG. 5 according to an embodiment of the present invention. The first limiter circuit 122 generates the upper eye mask by limiting the amplitude of the first sine wave, and the second limiter circuit 123 generates the lower eye mask by limiting the amplitude of the second sine wave that is 180 degrees out of phase with the first sine wave.

As illustrated in FIG. 6A, the first limiter circuit 122 includes a resistor R1. The first limiter circuit 122 also includes a first diode D1 and a first supply voltage source Va that define an upper border of the first sine wave. The first limiter circuit 122 further includes a second diode D2 and a second supply voltage source Vb that define a lower border of the first sine wave. The first limiter circuit 122 further includes a third supply voltage source Vc that changes a voltage of the first sine wave whose amplitude is defined.

Likewise, as illustrated in FIG. 6B, the second limiter circuit 123 includes a resistor R2, a third diode D3 and a fourth supply voltage source Vd that define an upper border of the second sine wave, and a fourth diode D4 and a fifth supply voltage source Ve that define a lower border of the second sine wave. The second limiter circuit 123 further includes a sixth supply voltage source Vf that changes a voltage of the second sine wave whose amplitude is defined.

An eye mask generated by the first and second limiter circuits 122 and 123 will now be described with reference to FIGS. 7A and B.

Figure 7A:
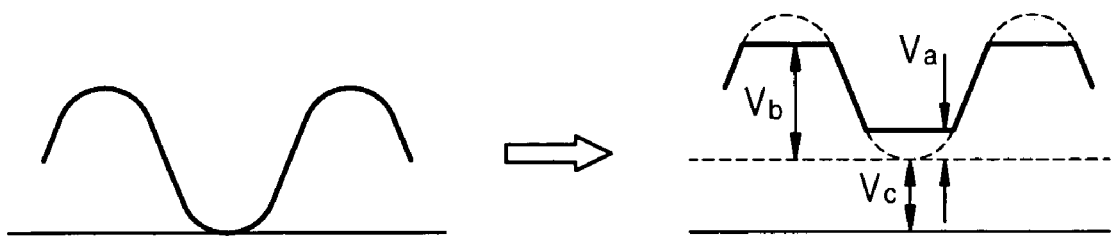
FIG. 7A illustrates an eye mask generated by the first limiter circuit shown in FIG. 6A according to an embodiment of the present invention.

Referring to FIG. 7A, the upper and lower borders of the first sine wave are respectively defined by the second supply voltage source Vb and the first supply voltage source Va in the circuit shown in FIG. 6A. Also, the voltage of the first sine wave is increased by the voltage of the third supply voltage source Vc, and output as a signal. The output signal forms the upper eye mask as described above.

Figure 7B:
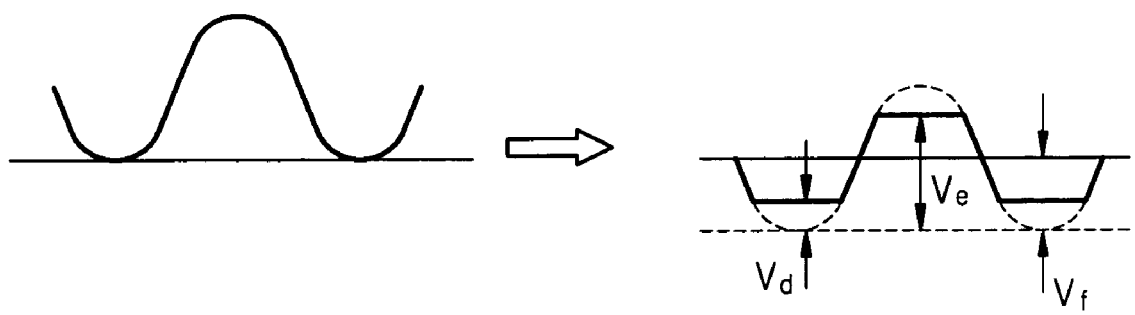
FIG. 7B illustrates an eye mask generated by the second limiter circuit shown in FIG. 6B according to an embodiment of the present invention.

Referring to FIG. 7B, the upper and lower parts of the second sine wave are respectively defined by the fifth supply voltage source Ve and the fourth supply voltage source Vd. Also, the voltage of the second sine wave is reduced by the voltage of the sixth supply voltage source Vf, and output as a signal, which forms the lower eye mask.

As described above, the eye mask is preferably formed to have a hexagonal shape. Thus, a supply voltage is set such that the difference in voltage between the first and second supply voltage sources Va and Vb of the upper eye mask is equal to the difference in voltage between the fourth and fifth supply voltage sources Vd and Ve of the lower eye mask. Also, the voltages of the lower and upper borders of the upper eye mask are equalized by controlling the voltages of the third and sixth supply voltage sources Vc and Vf, respectively.

Therefore, an eye mask generated from a sine wave may be formed roughly to have a hexagonal shape since the period and amplitude of the sine wave are not large. Also, it is possible to generate an eye mask similar to an eye mask of a test signal Rx by synchronizing a signal using the clock recovery circuit 111 or the PLL 112.

Figure 8:
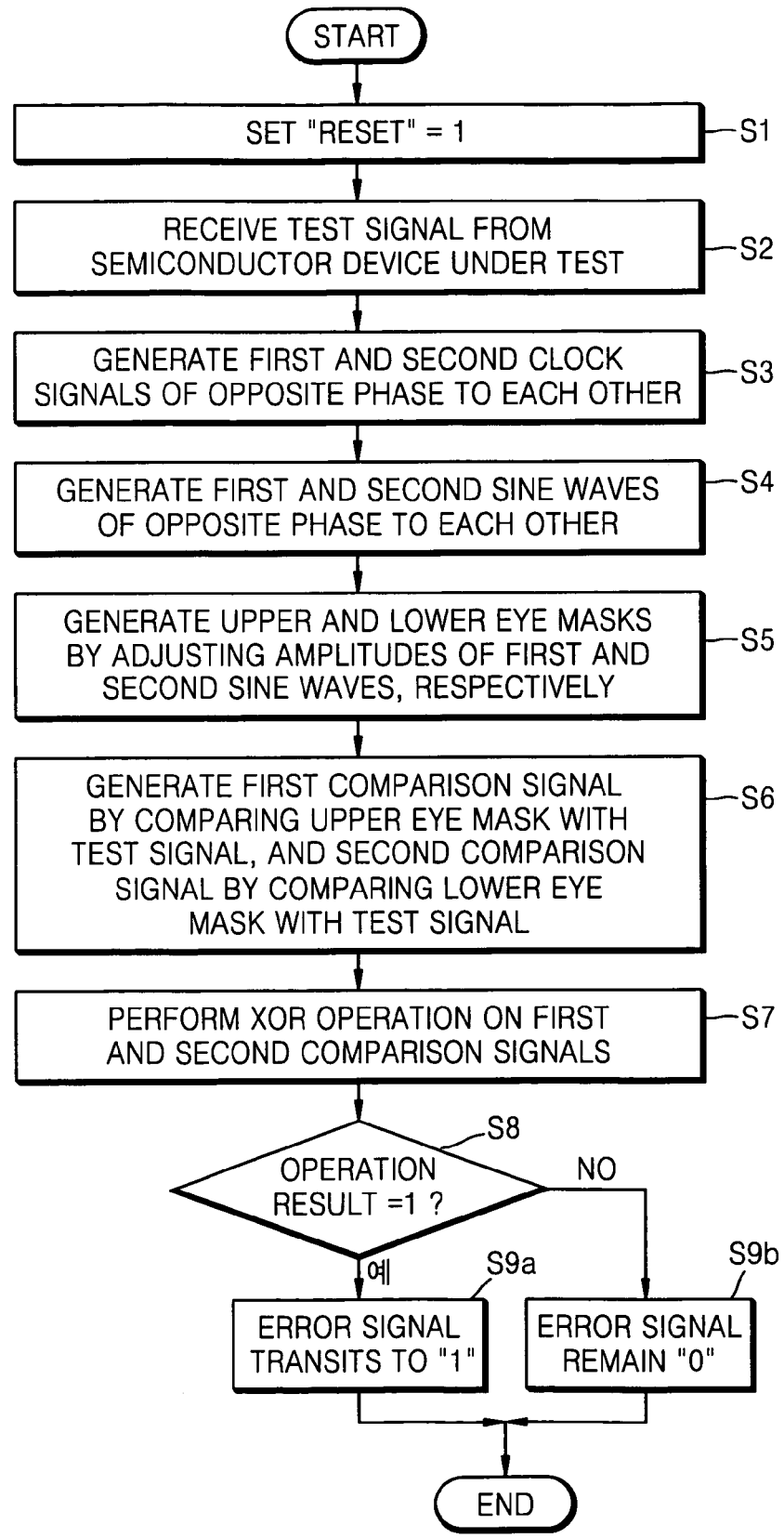
FIG. 8 is a flowchart illustrating a method of testing a semiconductor device according to an embodiment of the present invention.

FIG. 8 is a flowchart illustrating a method of testing a semiconductor device according to an embodiment of the present invention. Referring to FIG. 8, when a test of a semiconductor device begins, a reset signal for an error signal output unit is set to "1" to initialize the error signal output unit (S1).

Next, after voltages of first through sixth supply voltage sources that define a sine wave are set, a test apparatus applies a test pattern to the semiconductor device. Also, the applied test pattern is output as a test signal from an I/O circuit of the semiconductor device and then returned back to an I/O port of the test apparatus (S2).

Next, first and second clock signals having opposite phase are generated by a clock recovery circuit and a PLL (S3). Next, first and second sine waves are respectively generated in synchronization with the first and second clock signals (S4). The first and second sine waves have opposite phase with each other, in particular, the first and second sine waves may have phases of 0 degrees and 180 degrees, respectively.

Next, upper and lower eye masks are generated by adjusting the amplitude of the first sine wave and the amplitude of the second sine wave, respectively (S5). In detail, the upper eye mask is generated by adjusting the upper and lower borders of the first sine wave, and the lower eye mask is generated by adjusting the upper and lower borders of the second sine wave. In particular, an eye mask formed of the upper and lower eye masks is nearly hexagonal in shape.

After forming the upper and lower eye masks, the upper eye mask is compared with the test signal to generate a first comparison signal, and the lower eye mask is compared with the test signal to generate a second comparison signal (S6).

Next, a logic operation is performed on the first and second comparison signals to detect whether an error occurs in the semiconductor device that is operating (S7). The logic operation may be an XOR operation.

Thereafter, the result of the logic operation is checked (S8). If the result of the logic operation is a logic high value, that is, "1", the level of the test signal is located between the levels of the upper and lower eye masks, which means that an error occurs in the operation of an I/O circuit of the semiconductor device. In this case, an error signal transits to a logic high level, that is, a logic "1" level (S9*a*).

If the result of the logic operation is a logic low value, that is, "0", the level of the test signal is greater than or less than those of the upper and lower eye masks, which means that the I/O circuit of the semiconductor device operates normally. In this case, the error signal is at a logic low level, that is, a logic "0" level (S9*b*).

As described above, according to an embodiment of the present invention, an eye mask can be easily generated from sine waves and a time required to generate the eye mask can be reduced, thereby efficiently testing a high-speed semiconductor device. Also, an upper eye mask and a lower eye mask are separately computed to generate the eye mask, thereby more precisely testing the semiconductor device.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A test apparatus that tests a semiconductor device by providing a signal to the semiconductor device, receiving the signal back from the semiconductor device via a transmission line as a feedback signal, and analyzing the feedback signal as a test signal, the test apparatus comprising:
   an eye mask generator generating an eye mask formed of upper and lower portions by using two sine wave signals of different respective phases;
   an error detector receiving the eye mask from the eye mask generator, comparing the test signal with the upper and lower portions of the eye mask, and outputting an error detection signal based on a logic operation performed on the signals derived from the comparison results; and
   an error signal output unit receiving the error detection signal from the error detector and generating an error signal in response to the error detection signal,
   wherein the eye mask generator includes:
   a sine wave generator generating the two sine waves in synchronization with one or more clock signals; and
   a limiter circuit receiving the two sine waves, and generating the eye mask by limiting selected respective amplitudes of the two sine waves to a constant level during a partial period of the sine waves to respectively form the upper and lower portions of the eye mask.

2. The apparatus of claim 1, wherein the sine wave generator generates the two sine wave signals as a first sine wave and a second sine wave of opposite phase to each other, in synchronization with a clock signal derived from the test signal.

3. The apparatus of claim 2, wherein the limiter circuit comprises:
   a first limiter circuit receiving the first sine wave and generating the upper portion of the eye mask by selectively limiting amplitudes of the first sine wave; and
   a second limiter circuit receiving the second sine wave and generating the lower portion of the eye mask by selectively limiting amplitudes of the second sine wave.

4. The apparatus of claim 3, wherein the error detector comprises:
   a first comparator comparing the upper portion of the eye mask with the test signal;
   a second comparator comparing the lower portion of the eye mask with the test signal; and
   a logic operator receiving a respective comparison signal from the first comparator and the second comparator and generating the error detection signal by performing a logic operation on the comparison signals.

5. The apparatus of claim 4, wherein the first comparator generates a first comparison signal which is logic high when a logic level of the upper portion of the eye mask is greater than a logic level of the test signal.

6. The apparatus of claim 5, wherein the second comparator generates a second comparison signal which is logic high when a logic level of the lower portion of the eye mask is greater than a logic level of the test signal.

7. The apparatus of claim 6, wherein the logic gate is an XOR gate which performs an XOR operation on the first and second comparison signals.

8. The apparatus of claim 1, wherein the error signal output unit comprises a flipflop outputting the error signal when the error detection signal is logic high.

9. The apparatus of claim 1, further comprising a phase locked loop generating the one or more clock signals fed to the eye mask generator.

10. The apparatus of claim 9, further comprising a clock recovery circuit extracting a reference clock signal from the test signal received from the semiconductor device and applying the extracted reference clock signal to the phase locked loop.

11. An apparatus for generating an eye mask used for a semiconductor device test circuit by providing a signal to the semiconductor device, by receiving the signal back from the semiconductor device, which is to be tested, via a transmission line as a feedback signal, and comparing the feedback signal as a test signal with the eye mask, the apparatus comprising:
- a sine wave generator generating a first sine wave and a second sine wave of opposite phase to each other in synchronization with one or more clock signals;
- a first limiter circuit receiving the first sine wave and generating an upper portion of an eye mask by selectively limiting amplitudes of the first sine wave to a constant level during a partial period of the first sine wave;
- a second limiter circuit receiving the second sine wave and generating a lower portion of an eye mask by selectively limiting amplitudes of the second sine wave to a constant level during a partial period of the first sine wave; and
- an error detector comparing the test signal with the upper and lower portions of the eye mask and outputting an error detection signal based on a logic operation performed on the signals derived from the comparison results.

12. The apparatus of claim 11, wherein the first limiter circuit comprises:
- a first diode and a first supply voltage source that define an upper border of the first sine wave;
- a second diode and a second supply voltage source that define a lower border of the first sine wave; and
- a third supply voltage source changing a voltage of the first sine wave whose amplitude is defined by the first diode and the first supply voltage source and the second diode and the second supply voltage source.

13. The apparatus of claim 12, wherein the second limiter circuit comprises:
- a third diode and a fourth supply voltage source that define an upper border of the second sine wave;
- a fourth diode and a fifth supply voltage source that define a lower border of the second sine wave; and
- a sixth supply voltage source changing a voltage of the second sine wave whose amplitude is defined by the third diode and the fourth supply voltage source and the fourth diode and the fifth supply voltage source.

14. The apparatus of claim 13, wherein a difference in voltage between the first and second supply voltage sources is equal to a difference in voltage between the fourth and fifth supply voltage sources.

15. The apparatus of claim 14, wherein a voltage of the lower border of the upper portion of the eye mask is equal to a voltage of the upper border of the lower portion of the eye mask.

16. A method of testing a semiconductor device using a test circuit by providing a signal to the semiconductor device, by receiving the signal from the semiconductor device via a transmission line as a feedback signal, and by analyzing the feedback signal as a test signal, the method comprising:
- generating a first sine wave and a second sine wave of opposite phase to each other in synchronization with one or more clock signals;
- generating an upper portion of an eye mask by limiting an upper border and a lower border of the first sine wave to a constant level during a partial period of the first sine wave, and a lower portion of an eye mask by limiting an upper border and a lower border of the second sine wave to a constant level during a partial period of the second sine wave;
- determining whether an error occurs by comparing the test signal sequentially with the upper portion and the lower portion of the eye mask and outputting an error detection signal based on a logic operation performed on the signals derived from the comparison results; and
- generating an error signal in response to the error detection signal indicating whether the error occurs.

17. The method of claim 16, wherein the first and second sine waves are respectively generated in synchronization with clock signals of opposite phase to each other derived from the received signal.

18. The method of claim 17, wherein an eye mask formed of the upper portion and the lower portion of the eye mask has a hexagonal shape.

19. The method of claim 18, wherein, while determining whether the error occurs, an error detection signal is generated by performing an XOR operation on a first comparison signal generated by comparing the test signal with the upper portion of the eye mask, and on a second comparison signal generated by comparing the test signal with the lower portion of the eye mask.

20. The apparatus of claim 1, wherein the amplitude of one sine wave of the two sine waves is limited to the constant level that is lower than a maximum level of the one sine wave during the partial period to form the upper eye mask and the amplitude of the other sine wave of the two sine waves is limited to the constant level that is higher than a minimum level of the other sine wave during the partial period to form the lower eye mask.

21. The apparatus of claim 11, wherein the amplitude of the first sine wave is limited to the constant level that is lower than a maximum level of the first sine wave during the partial period to form the upper portion of the eye mask and the amplitude of the second sine wave is limited to the constant level that is higher than a minimum level of the second sine wave during the partial period to form the lower portion of the eye mask.

22. The apparatus of claim 16, wherein the amplitude of the first sine wave is limited to the constant level that is lower than a maximum level of the first sine wave during the partial period to form the upper portion of the eye mask and an amplitude of the second sine wave is limited to the constant level that is higher than a minimum level of the second sine wave during the partial period to form the lower portion of the eye mask.

* * * * *